(12) United States Patent
Brunner et al.

(10) Patent No.: US 8,009,299 B2
(45) Date of Patent: Aug. 30, 2011

(54) METHOD FOR BEAM CALIBRATION AND USAGE OF A CALIBRATION BODY

(75) Inventors: Matthias Brunner, Kirchheim-Heimstetten (DE); Ralf Schmid, Poing (DE); Bernhard Mueller, Finsing (DE); Axel Wenzel, Augsburg (DE)

(73) Assignee: Applied Materials GmbH, Dresden (DE)

( * ) Notice: Subject to any disclaimer, the term of this patent is extended or adjusted under 35 U.S.C. 154(b) by 469 days.

(21) Appl. No.: 11/813,334

(22) PCT Filed: Jan. 5, 2006

(86) PCT No.: PCT/EP2006/000068
§ 371 (c)(1),
(2), (4) Date: Mar. 12, 2009

(87) PCT Pub. No.: WO2006/072583
PCT Pub. Date: Jul. 13, 2006

(65) Prior Publication Data
US 2010/0188666 A1 Jul. 29, 2010

(30) Foreign Application Priority Data
Jan. 5, 2005 (DE) .................. 10 2005 000 813

(51) Int. Cl.
*G01B 11/14* (2006.01)
(52) U.S. Cl. ........................................ 356/614
(58) Field of Classification Search ............. 356/614, 356/615, 616
See application file for complete search history.

(56) References Cited

U.S. PATENT DOCUMENTS

| | | | | |
|---|---|---|---|---|
| 5,136,169 A * | 8/1992 | Smith et al. | | 250/491.1 |
| 5,345,085 A * | 9/1994 | Prior | | 250/491.1 |
| 5,434,422 A * | 7/1995 | Iwamoto et al. | | 250/491.1 |
| 5,892,230 A * | 4/1999 | Goodberlet et al. | | 250/361 R |
| 6,392,242 B1 * | 5/2002 | Perkins et al. | | 250/491.1 |
| 6,528,219 B1 | 3/2003 | Conrad et al. | | |
| 7,417,234 B2 * | 8/2008 | Hastings et al. | | 250/397 |
| 2002/0039828 A1 | 4/2002 | Hahmann et al. | | |
| 2003/0089863 A1 * | 5/2003 | Hirayanagi | | 250/492.2 |

OTHER PUBLICATIONS

PCT International Preliminary Report on Patentability dated Jul. 10, 2007.
PCT International Search Report dated Jan. 17, 2007 for International Application No. PCT/EP2006/00068.
PCT International Search Report dated Jan. 17, 2007 for International Application No. PCT/EP2006/00068.

* cited by examiner

*Primary Examiner* — Roy Punnoose
(74) *Attorney, Agent, or Firm* — Patterson & Sheridan, L.L.P.

(57) ABSTRACT

The invention relates to a method of calibration of the beam position of a corpuscular beam. A calibration body with structures is used, wherein the structures have a structure period $P_S$ in the plain section and within each structure there is a position L intended for the measurement. For the calibration, at least one detection signal each at structures in the plain section of the calibration body is generated, wherein the corpuscular beam is deflected with deflectors on beam target positions $L_1$ with the beam target period $P_1$, which is larger than half of the structure period $P_S$, whereby a basic calibration is used for the control of the deflectors, and wherein the beam target deflections deviate either in the beam target period $P_1$ from the structure period $P_S$ and/or in the beam target position $L_1$ from the position L.

22 Claims, 7 Drawing Sheets

METHOD FOR BEAM CALIBRATION AND USAGE OF A CALIBRATION BODY

BACKGROUND OF THE INVENTION

1. Field of the Invention

The present invention relates to a method, which uses corpuscular beams, and for which the positioning of the corpuscular beams is necessary, such as testing with corpuscular beams. Particularly, the present invention relates to methods for calibrating the beam position and means qualified therefore. Specifically, the present invention relates to a method for calibration of the beam position of the corpuscular beam of a testing device and the usage of a product for calibration of the beam position.

On increasing demand for display elements without a cathode ray tube, the requirements increase for liquid crystal displays (LCD) and other display elements, for which control elements such as thin-film transistors (TFT) are used. For those display elements, the picture elements, so-called pixels, are arranged in an array.

2. Description of the Related Art

In order to assure a good picture quality of the display elements, only very few of the for example several million pixels may be defective. In order to provide an inexpensive production, it is, thus, especially for the display elements steadily increasing in size, important to provide effective in-line test methods. Such a test method is for example disclosed in publication EP 0523584. For these test methods, the individual picture elements are tested with a corpuscular beam. The corpuscular beam can either be used to detect charge applied via the supply lines and/or it can be used to apply charge on a pixel electrode.

For the test methods of the individual picture elements, it is inter alia necessary to scan or to address the picture elements with the corpuscular beam. That is, the corpuscular beam is to be guided on individual picture elements. In case of charged particles as corpuscles, this deflection may be carried out by magnetic, electrostatic or magneto-electrostatic deflectors. In case of photons as corpuscles, the deflection may be carried out by mirrors or other suitable means.

The necessary control of the deflectors depends on the geometrical arrangement and on the characteristic of the electronic, and is without calibration not exactly known because of the tolerances. Further, the correlation between the control current or the deflection voltage and the deflection of the corpuscular beams is not linear. A calibration of the beam position is necessary, so that the deflector can be controlled accordingly during a test method. The intention of the calibration is to assign to each coordinate x,y in a substrate plane, a beam coordinate in the control processor (x*,y*) or the values thereof (x,y), that is currents or voltages, for the control.

Such a calibration is particularly necessary for the test of LCD displays with an electron beam, for which the beam needs to be positioned on the pixels of the display. However, calibration may also be necessary for other methods, which irradiate the substrate with a corpuscular beam, such as a laser beam, a light beam, an ion beam, or an electron beam for testing or processing.

According to the prior art, for the calibration of the beam position, a pattern sample especially produced therefore is fabricated, which provides certain features at predetermined positions. In case of LCD displays, coated glass plates are provided, which have so-called L-features in larger regular distances. The positions of the features are known. If the calibration plate is scanned with for example an image forming electron microscope, it is possible to the position of the L.-features. The known positions of the detected features may be related to the signals in the control processor. Thereby, a calibration of the beam position of the corpuscular beam is possible.

As a result of the displays increasing in size, it becomes increasingly difficult and expensive to fabricate suitable calibration substrates. Further, these specific substrates need to be stored and need, if required, to be introduced in the apparatus to calibrate the beam positions.

BRIEF SUMMARY OF THE INVENTION

The above-mentioned problems of the prior art are solved by the method according to the present invention, as well as the usage according to the invention and the computer program product according to the invention.

Further features, aspects and details of the present invention are evident from the dependent claims, the description and the drawings.

According to one aspect of the present invention, a method for calibration of the beam position of a corpuscular beam of a corpuscular beam device in a plane section is provided. A calibration body with structures is provided, wherein the structures have a structure period $P_S$ in the plain section. Each structure has a target measurement position L for the measurement of the structure. At least one detection signal each is generated at the structures in the plane section of the calibration body by guiding the corpuscular beam with deflectors on the beam target position $L_1$ with the beam target period $P_1$. The beam target period is larger than half of the structure period $P_S$ of the structures. A basic calibration is used for control of the deflectors. The beam target deflection differs either in the beam target period $P_1$ from the structure period $P_S$ and/or in the beam target position $L_1$ from target measurement position L. Signals are detected, which depend from the location within one structure, respectively, of the calibration body. The generated detector signals are evaluated with determination of the deviation of the beam actual position $L_{1'}$, generated by the beam target position $L_1$ from the target measurement position L. and/or the deviation from the beam actual period $P_{1'}$ generated by the beam target period $P_1$ from the structure period $P_S$. A new calibration is calculated based on the evaluation.

With this method it is possible to conduct a calibration with arbitrary periodic structures, without needing calibrations plates specifically fabricated therefor. Further, the calibration method is better adapted to the future application of the corpuscular beam device.

According to a further aspect of the present invention, a method for calibration of the beam position of a corpuscular beam of a corpuscular beam device in a plane section is provided. A calibration body with structures is provided, wherein the structures have a structure period $P_S$ in the plain section. Each structure has a target measurement position L for the measurement of the structure. At least one detection signal each is generated at the structures in the plane section of the calibration body by guiding the corpuscular beam with deflectors on the beam target position $L_1$ with the beam target period $P_1$. A basic calibration is used for control of the deflectors. The beam target deflection differs either in the beam target period $P_1$ from the structure period $P_S$ and/or in the beam target position $L_1$ from target measurement position L. Signals are detected, which depend from the location within one structure, respectively, of the calibration body. For the calibration, the deviation of the beam actual period $P_{1'}$ of the measurement points from the beam target period $P_1$ of the measurement points and/or the deviation of the beam actual position $L_{1'}$ of the measurement points from the beam target position $L_1$ of the measurement points is determined, wherein the determination of the deviation is based on calculations using at least 50%, preferably at least 80% of the measured signals. A new calibration is calculated based on the evaluation.

According to a further aspect of the present invention, a method for calibration of the beam position of a corpuscular beam of a testing device in a plane section is provided. A calibration body with structures is provided, wherein the structures have a structure period $P_S$ in the plain section. Each structure has a target measurement position L for the measurement of the structure. At least one detection signal each is generated at the structures in the plane section of the calibration body by guiding the corpuscular beam with deflectors on the beam target position $L_1$ with the beam target period $P_1$. A basic calibration is used for control of the deflectors. The beam target deflection differs either in the beam target period $P_1$ from the structure period $P_S$ and/or in the beam target position $L_1$ from target measurement position L. Signals are detected, which depend from the location within one structure, respectively, of the calibration body. For the calibration, the beam actual period $P_{1'}$ of the measurement points and/or the beam actual position $L_{1'}$ of the measurement is determined, and thereby, for determination of one beam actual period $P_{1'}$ and/or one beam actual position $L_{1'}$ several structures are irradiated with the corpuscular beam. A new calibration is calculated based on the evaluation.

According to these aspects, it is possible to conduct a calibration with arbitrary periodic structures, without needing calibrations plates specifically fabricated therefor. Further, the calibration method is better adapted to the future application of the corpuscular beam device.

According to a further aspect, the evaluation is carried out by determination a first standard deviation of the detection signals gained in the plane section, which have been detected with a measurement at several structures. Particularly, typically further detection signals are generated at the structures in the plane section of the measurement body with a modified beam target deflection with respect to the beam target period $P_1$ and/or the beam target position $L_1$, and a second standard deviation of the signals is determined of the modified beam target deflection. The second standard deviation is compared to the first standard deviation. For a constant deviation over the entire area to be calibrated, alternatively it is also possible to choose the entire area to be calibrated as the plane section.

According to a further aspect the evaluation of the detection signals is carried out by determining the period $P_3$ of the intensity curve run (intensity waveform), which originates from the superposition of the structure period $P_S$ and the beam actual period $P_{1'}$ resulting from the beam target period $P_1$. Alternatively, it is also possible to choose the entire area to be calibrated as the plane section.

According to a further aspect, the structure period $P_S$ of the structures of the calibration body is in the range of 50 μm to 500 μm. Therefore, similar values result for the distances of the measurement points of the corpuscular beam as compared to the ones used during the normal testing operation of for example a display. Varying drift effects between the calibration and the future application of the calibration can be reduced through this.

According to a further aspect, the structures of the calibration body are picture element structures of a display array generated on a glass plate.

According to a further aspect, the beam target period $P_1$ has a deviation from the structure period $P_S$ in the range of 1% to 20%. Thereby, it can be ensured for the deviation of the superposing period $P_3$, that the superposition originates from a larger period of the measurement points as compared to the period of the structures or that the superposition originates from a smaller period of the measurement points as compared to the period of the structures.

According to a further aspect of the present invention, a calibration body is used. This use occurs in a method for calibration of the beam position of a corpuscular beam. The calibration body includes structures having distances with a structure period $P_S$. The period is in a range of 0.005% to 0.5%, preferably in a range from 0.01% to 0.2% of the deflection range of the corpuscular beam device, for which the calibration body is used. This range typically corresponds to a period in the range of 10 μm to 1.5 mm, preferably in the range of 30 μm to 600 μm.

According to further aspect of the present invention, a calibration body is used. This occurs in a method for calibration of the beam position of a corpuscular beam. The calibration body includes structures having distances with a structure period $P_S$; wherein the structure period $P_S$ is in the range of 0.5 to 2 times the period of the structures tested in the future.

According to a further aspect of the present invention, a display or an intermediate product generated during the manufacturing of a display is used as a calibration body in a method for calibration of the beam position of a corpuscular beam.

Above-mentioned aspects for the method for calibration can also be used for the usage of the calibration body for the calibration of the beam position individually or in combination.

Within the present invention, according to a further aspect or within the above-mentioned aspects, the beam target position is found out, for which the beam actual position is as close as possible to the position L. of the structure intended for the measurement or as close as possible to the position L within the structure intended for the measurement.

The present invention also relates to apparatuses which are used for practicing the described methods. Thereby, corresponding components are provided for practicing the individual method steps. Further, the present invention relates to hardware or software, which is utilized in the describe methods.

Preferred embodiments and special aspects of the invention get evident from the dependent claims.

BRIEF DESCRIPTION OF THE DRAWINGS

Embodiments of the invention are shown in the figures and are exemplarily described in more detail as follows.

It shows:

FIG. 11a shows a schematic diagram of a calibration body according to the prior art; an and FIG. 11b shows and enlargement of FIG. 11a.

DETAILED DESCRIPTION OF THE INVENTION

In the following, the invention is exemplarily described by the calibration of an electron beam. The invention can also be conducted with beams of other charged particle beams, such as ions. Further, also the following particles can be seen as corpuscles in the meaning of the invention: charged particles like electrons or ions; or photons as light beams or coherent light beams in the form of laser beams.

Figure 11A:
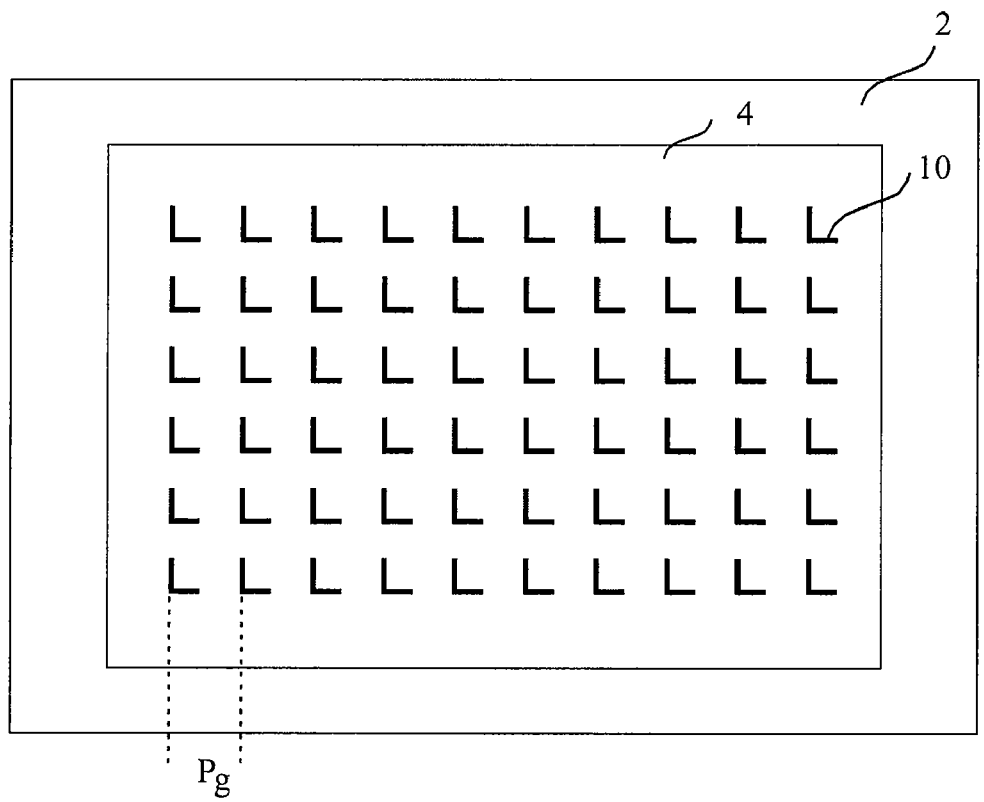
Figure 11B:
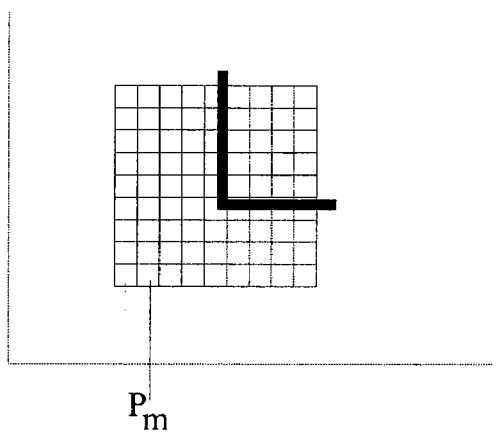

FIG. 11a shows an embodiment according to the prior art. A schematic overview of a calibration substrate 2 for calibration of the beam position of a corpuscular beam is shown. In larger distances having the period $P_g$ of about 2.5 mm, L-features 10 are provided in the image area 4 on the substrate 2, which has been specifically fabricated therefore. The positions L of the individual features are predetermined. The electron beam is sequentially guided on each one of the L-features, respectively. Since a satisfying calibration of the beam position is not yet provided, the electron beam will not hit the feature exactly. For this reason, an area about the feature is scanned. Such an area is shown in a larger scale in FIG. 11b. The electron beam is moved over an area of the substrate, wherein a period between the individual measurements points is used, which substantially reflects the resolution of the electron microscope. The resolution, that is the period $P_m$, typically is in the range of 0.2 μm to 20 μm for the testing purposes of large substrates in the range of 100 mm to several 1000 mm display size, which are subject here.

The position of each L-feature within the respective area can be determined by evaluation of the detection of each area around the feature. The beam position is used, for which the feature is hit at a predetermined position. The beam position of the electron beam can be calibrated since the actual location of the feature is known.

Thus, the L-features 10 form structures on the substrate, which have a distance with a period $P_g$. The successively addressed measurement points have much smaller distance with a period $P_m$. The distance of the period Pm is for example 4 μm. This distance of the periods p.m. is in the range of 1/500 to 1/2000 of the distance of the periods $P_g$. The smaller the distance of the measurement points is with respect to each other, that is the better the resolution of the localization of the L-features get, the better will be a calibration based on these measurements.

This tendency towards a distance of the measurement points being as small as possible results, however amongst other things, also in an increasing charge density applied to the substrate. Therefore, for the method according to the prior art, it is necessary to coat the substrate with a conductive layer. The use of another product, which also includes isolating areas, is hardly possible for the calibration according to the prior art.

Further, the calibration according to the prior art has the problem that during the test of the display, the individual pixels are addressed with the period $P_S$. That is, the increment between the individual measurement points to which the electron beam is guided for the future testing, is $P_S$. By choosing for the calibration a by far smaller increment between the measurement points of the electron beam, drift effects occur, which are different as compared to the drift effects occurring in the future reality.

Figure 1:
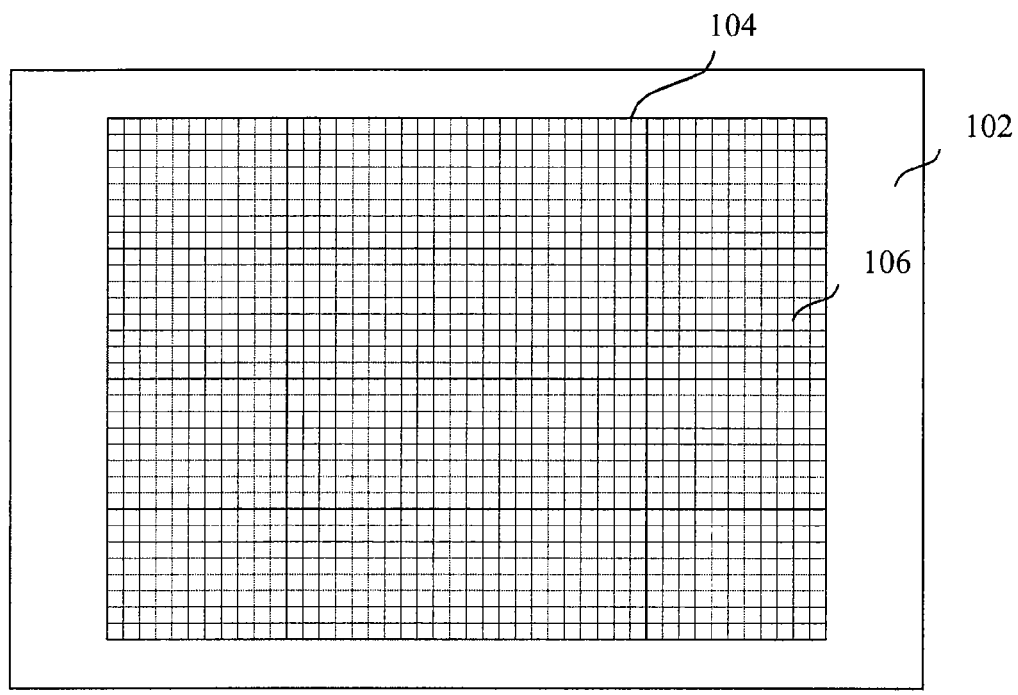
FIG. 1 shows a schematic illustration of the substrate with picture elements included in a display area.

FIG. 1 shows a calibration body as used within the present invention. An image area 104 exists on the substrate 102. Individual picture elements 106 (pixel) are present within the image area. For instance, this calibration body can be a completed LCD-display. For simplification, the pixels 106 are shown in an enlarged scale. Depending on the size of the display, the calibration body respectively, or on the size of the testing assembly the beam position of which is to be calibrated, there are between several thousand picture elements and several million picture elements. The size of the picture elements 106 or the distance thereof is in the range of 40 μm to 400 μm, 1 mm at most. A typical 15"-TFT-display has for example 0.7 megapixels at a pixel size of 0.297 mm. Larger display elements, as used for example for television with white aspect ratio (16:9), also may have several megapixels.

However, as described above, not only completed display elements such as a TFT-display can be used as a calibration body. Intermediate products, which are generated during manufacturing of for example a display or masks, which already exist for the manufacturing, may be used for the calibration of the beam position. Further, also another plate with corresponding periodic structures may be used as a calibration plate.

The use of displays or image areas with picture elements, and intermediate products or masks with structures corresponding to the picture elements according to the invention, results in the fact that no separate calibration bodies need to be manufactured. Further, the testing of substrates does not need to be interrupted for the calibration in a manner, that a separate calibration body as shown in FIG. 11a is introduced in the equipment.

The calibration of the beam position is conducted with the bodies, which are provided in the equipment in line with the production during testing. The structures relevant for the calibration, which corresponds to the L-features in FIG. 11a, are provided by the picture elements/pixels or structures corresponding to the picture elements on the intermediate products or a masks.

Within this application, a structure is to be understood for example as a pixel or a corresponding feature of an intermediate product, a mask or another plate, within which it should be measured at a beam target position L. The pixels and the beam target positions have a structure period $P_S$. However, also a feature within a pixel or the like, that is a transistor or a feeding line to the pixel, may be understood as a structure. These structures also have a structure period $P_S$. The measurement should be conducted within the structures at the beam target position L. In both cases, a deviation of the detection signals occurs if a measurement is conducted at a beam actual position deviating from the beam target position.

Figure 2:
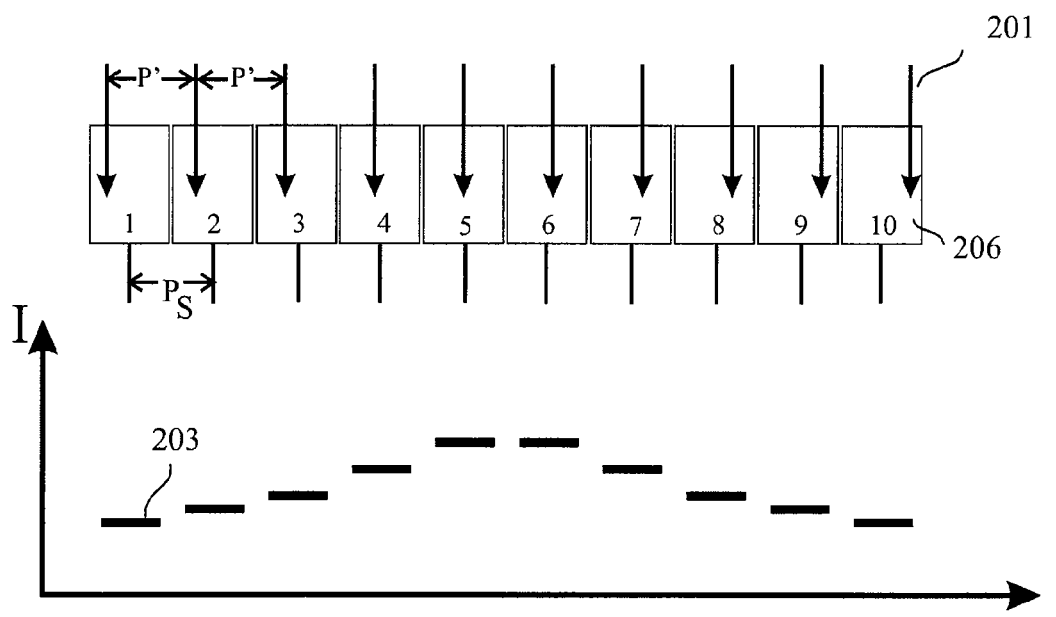
FIG. 2 shows a schematic illustration of measurements and the result therefrom, for which an electron beam is scanned over individual picture elements.

FIG. 2 serves as an explanation for the methods and the usages, which are further explained in the following. Similar to the following figures, FIG. 2 also shows a one-dimensional arrangement of picture elements 206. This illustration is provided for simplification. The invention may also be used for a two-dimensional calibration.

The picture elements are irradiated with an electron beam and the resulting signal is detected. Within the illustration shown in FIG. 2, the signal intensity I is shown as a function of the location L. Thereby, a signal exists for each location with the distance of the beam actual period P'.

The signals may be those generated by a detector, which are gained by the detection of secondary particles, for example secondary electrons or scattered electrons. The secondary particles are generated with the primary corpuscular beam. The signals may also be present in form of a current, which are measured at feeding lines to the calibration body. These currents are also generated by irradiation of the corpuscular beam on the structures, that is the picture elements. In the case of laser beams, the signals may originate from a photo diode, which detects reflected, scattered or emitted photons.

The electron beam 201 is guided one substantially one position per structure (picture element) for the methods and the usages. The structures 206, that is the picture elements or the structures corresponding to the picture elements for an intermediate product, result in an intensity at signal detection. This intensity varies depending on the location within a structure, at which the electron beam hits the structure. FIG. 2 shows a series of measurements, for which the electron beam is guided on locations with a distance of the beam actual period P. '. This distance does not exactly correspond to the distance of the structures (pixels) with respect to each other. The outcome is, that the center pixels with number 5 and 6 are almost hit in the middle of the structure, which results in a relatively high intensity. The intensity of the detected signal decreases, the further the respective pixels are a hit by electron beam on the edge thereof.

Consequently, the signal detected in line with the calibration of the beam position depends on the location excited within the structure. The signals depend on the fact, if the structure, for example the pixel, is hit by the corpuscular beam in the middle, on the edge or even between two pixels. This difference may originate in material contrast, voltage contrast or in contrast of topography. In the case of a laser beam, the contrast may originate in different reflection, absorption or color.

For the measurement method shown in FIG. 2, it is true that the measurement distance (period P') between the locations, on which the electron beam hits on the object to be measured, is comparable to the distance (period $P_S$) of the structures. Generally, for the methods and usages disclosed within this patent application, P' is larger than ½ $P_S$. Typically, P' is about the same dimension as $P_S$.

However, also embodiments are possible, for which every second or every third pixel, that is every second or every third calibration structure is measured. Then, the distance of the measurement points with the beam actual period P' is a multiple of the distance of the structures with the structure period PS.

In line with the present invention, it is acted on a basic calibration. This basic calibration can be the calibration, which has been conducted last. Then, quasi a recalibration of the system is concerned.

On initial operation of the device, in which a corpuscular beam is scanned over the substrate, the method may not only be used for recalibration but also for a primary or new calibration. In this case, the basic calibration may for example consist of data which has been gained at a type constructed in the same way. Further, there is the alternative to use calculated values as a basic calibration. The calculated values may also be gained from a matrix or an allocation table (look-up table) of another device or an old calibration.

The calibrations may be provided in form of an allocation table (look-up table). Thereby, a calibration raster is stored in a data set. In this data set, the values for the control of the deflectors with the respective corresponding positions are stored. For beam positions between the stored positions, an interpolation may for example be conducted. Further it is possible to provide the calibration in form of mathematical functions, which give a value or values for the control of the deflectors as a function of the location to be addressed.

Figure 3:
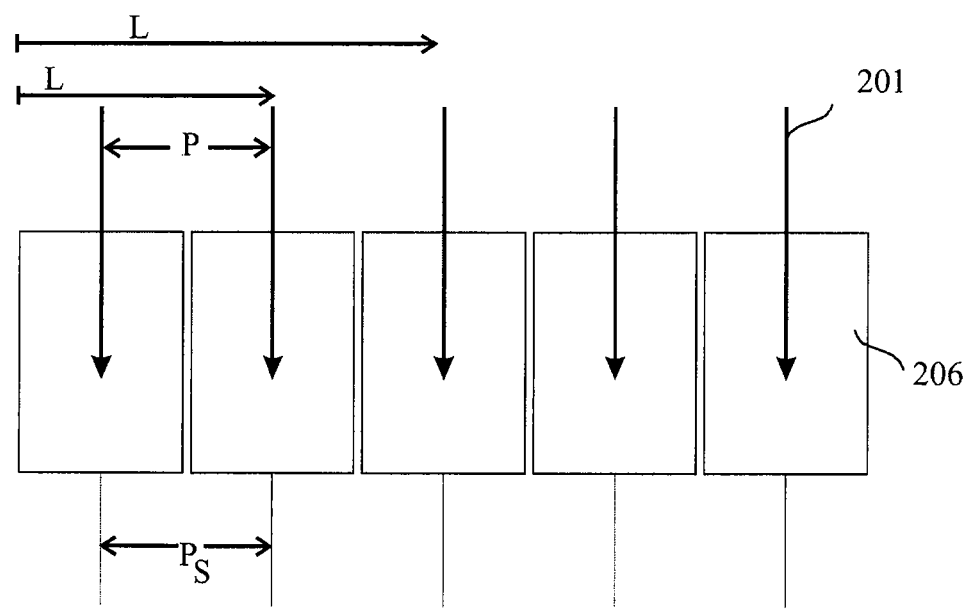
FIG. 3 shows a schematic illustration of measurements of a good calibration.

Assuming initially the existence of a correct calibration, a situation as described by FIG. 3 emerges for the present measurement method. The picture elements 206 serving as measurement structures for the calibration have distances with the structure period $P_S$. The electron beam 201 is guided at the respective positions L, so that each structure is measured at a location. The measurement points, that is the positions L, have distances with the beam target period P. As shown in FIG. 3, by using a good calibration, each picture element (pixel) is irradiated in the middle or the designated target measurement position by the corpuscular beam and the signal resulting therefrom is detected.

Figure 4:
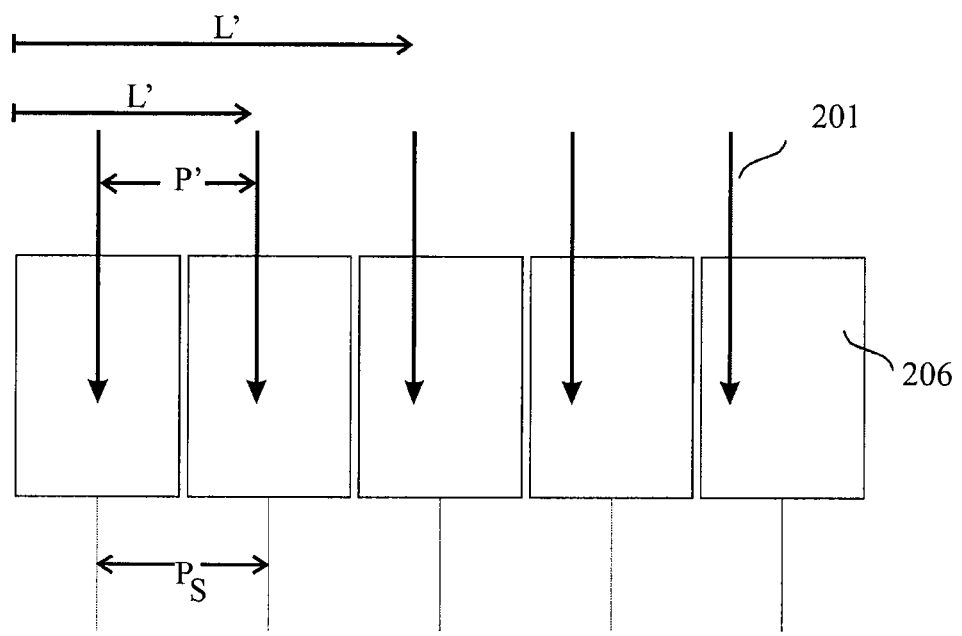
FIG. 4 shows a schematic illustration of measurements with a bad calibration.

For and imperfect basic calibration, based on which a new calibration is generated, a situation as shown in FIG. 4 emerges. The attempt to address the target measurement position L (see FIG. 3) results in a positioning of the electron beam at the positions U. The distances of the measurement points may also have a erroneous distance with the period P'. The imprecise beam positioning based on the imperfect basic calibration may either only result in erroneous positions L' or may also result in the erroneous period P'. In the second case, as a result of the wrong calibration of the distances, some of the structures 206 are also irradiated by the electron beam on the erroneous positions U.

For the present method for calibration of the beam position of a corpuscular beam, measurements in several limited areas of the substrate or over the entire image area 104 are conducted. For these measurements, the deflectors are controlled in a manner, that either the distances of the measurement points deviate in the beam target period $P_1$ from the distances of the structure period $P_S$ or that the positions $L_1$ deviate from the positions L. As a further alternative, the period and the positions may be varied. A control with an alignment error is conducted. In other words, a beam deflection is applied, that would, for a good calibration, not result in a beam positioning at the target measurement position or the center of the structures 206. This introduced alignment error relates, thus, to the beam target positions of the corpuscular beam. This is shown for a deviating beam target period P1 in FIGS. 5 and 6. This is shown for deviating positions L1 in FIGS. 7 and 8. The evaluation methods, which may be conducted with these measurements, are described with respect to the FIG. 9 and FIG. 10.

Figure 5:
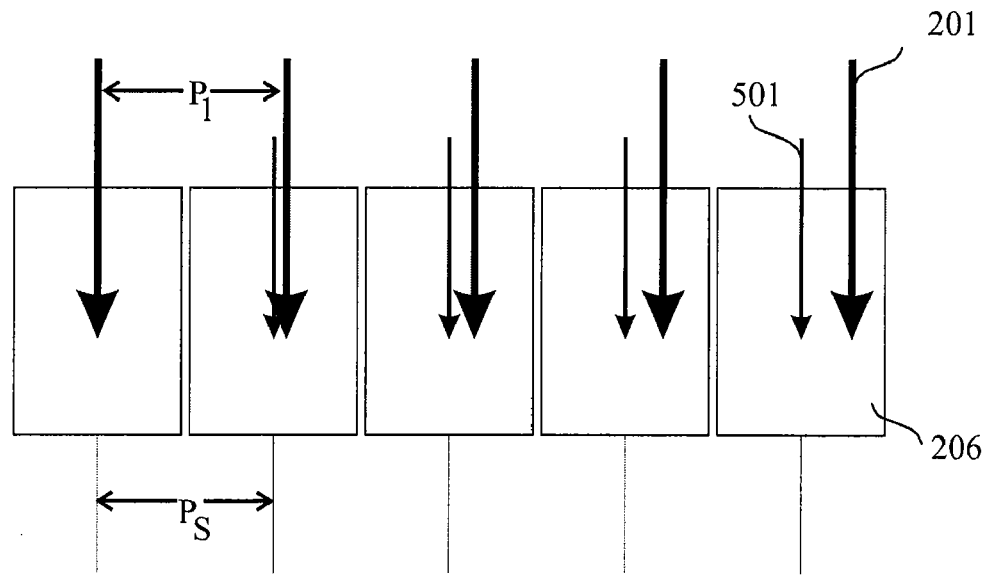
FIG. 5 shows a schematic illustration of measurements with a first alignment mistake for a good calibration.

FIG. 5 shows the measurement at a section with five calibration structures. If the completed display is used as calibration body, these structures 206 are provided by the individual pixels of the display. The structures have distances with the structure period $P_S$. A situation with a correct calibration is shown, such that the alignment error introduced on control results in larger distances of the electron beams 201 with the beam target period $P_1$ greater $P_S$. The smaller arrows 501 with in FIG. 5 show the positions, which would correspond to distances of the measurement points with a period $P=P_S$. The alignment error introduced with respect to the period $P_1$, is, in FIG. 5, chosen as an example with $P_1 > P_S$. The alignment error can alternatively, or additionally in a further measurement, also be choosing to be $P_1 < P_S$.

Figure 6:
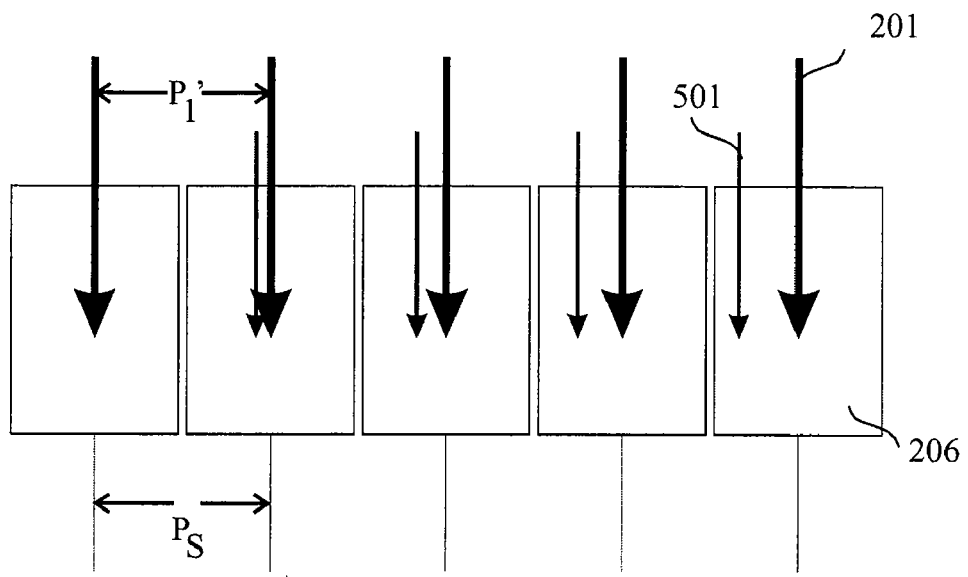
FIG. 6 shows a schematic illustration of measurements with a first alignment mistake for a bad calibration.

FIG. 6 shows the same result with a bad calibration. As a result of the bad basic calibration, the choice of the beam target period $P_1$ results in the beam actual period $P_1$, which is similar to the structure period $P_S$ of the structures. The smaller arrows 501 show the positions, which would correspond to the distances of the measurement points for the target period P at a bad basic calibration.

Analog to the intended choice of a beam target period $P_1$, which deviates from the structure period $P_S$, as described with respect to FIGS. 5 and 6, FIGS. 7 and 8 show an intended choice of positions $L_1$, which deviates from the center positions within the structures 206.

Figure 7:
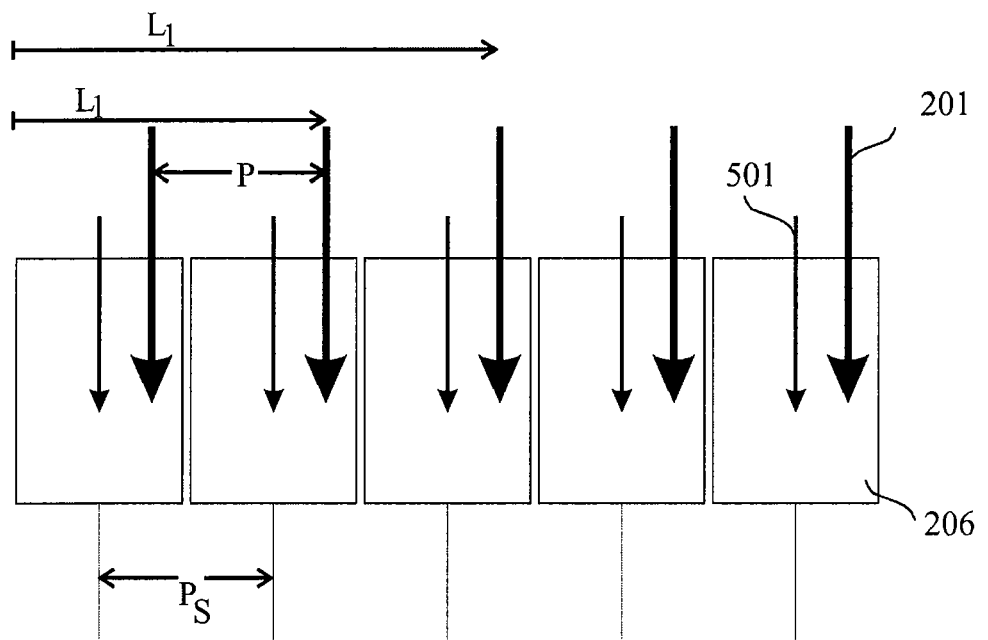
FIG. 7 shows a schematic illustration of measurements with a second alignment mistake for a good calibration.
Figure 8:
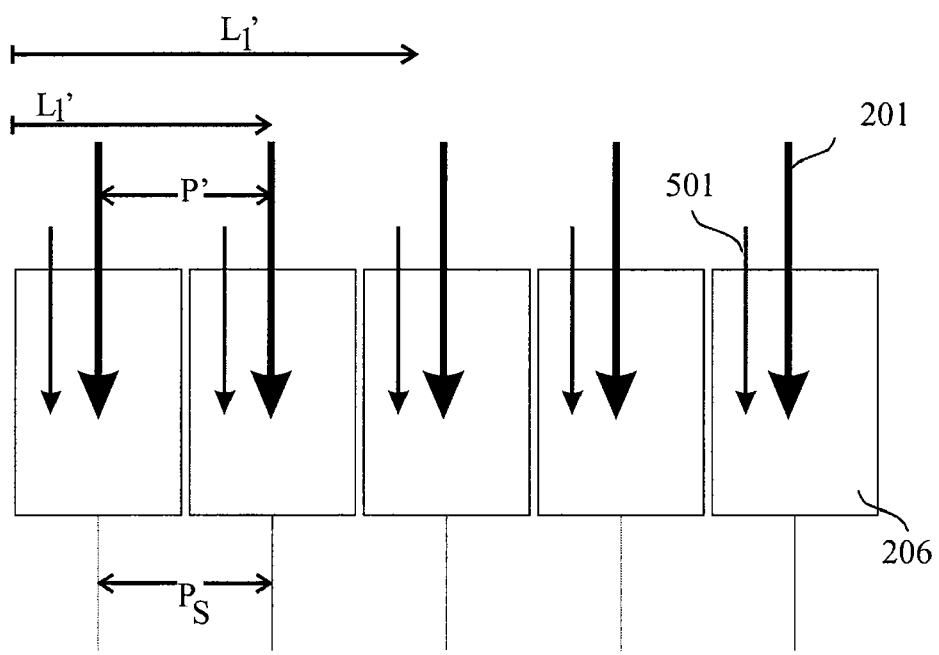
FIG. 8 shows a schematic illustration of measurements with a second alignment mistake for a bad calibration.

For a good calibration as shown in FIG. 7, the choice of the beam target positions $L_1$ of the electron beams 201 result in a displacement with respect to the center of the structures. The smaller arrows 501 symbolize again the beam positions for the control of the deflectors on the target position L. If there is a bad calibration, as shown in FIG. 8, the beam actual positions $L_{1'}$ deviate from the beam target positions $L_1$ (see FIG. 7), which results in a better beam positioning. Again, the smaller arrows 501 show the positions, which would have been gained at the target positions L with the bad calibration.

Figure 9A:
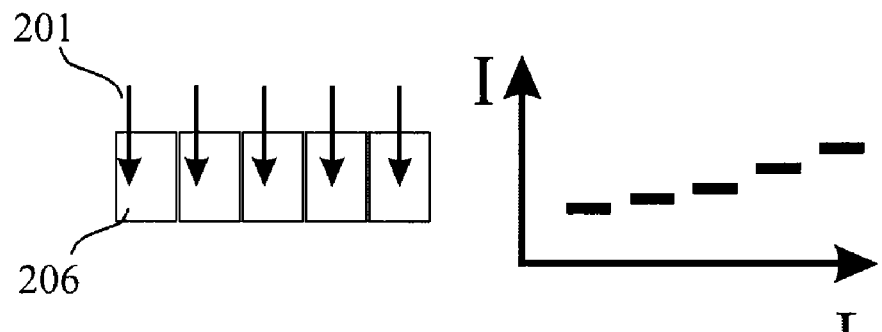
FIGS. 9a to 9c show schematic illustrations for explanation of a first evaluation method.
Figure 9B:
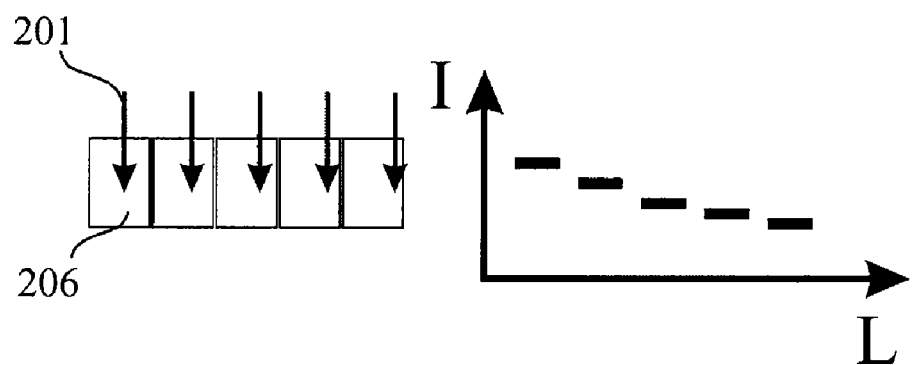
Figure 9C:
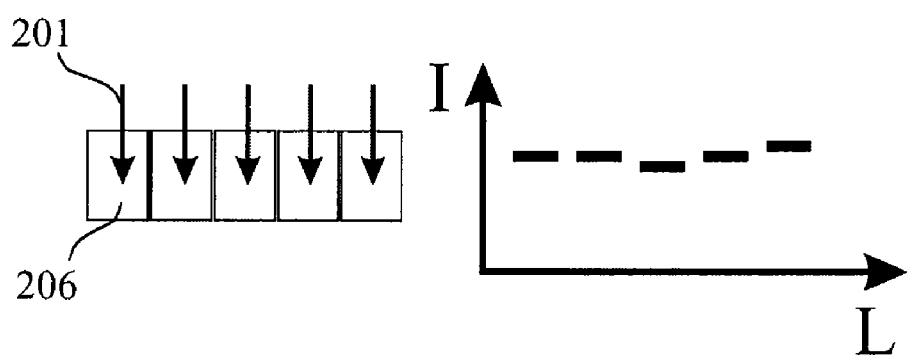

A first method for evaluation of the measurements in a section of the calibration substrate is described with respect to FIGS. 9a to 9c. The figures show five structures 206 each, on which the electron beam 201 is guided. The electron beam is guided on a position within the structure each. Assuming that the deflectors have been controlled for the measurements in FIG. 9a, such that based on the basic calibration the respective centers of the structures (positions L and period P.) should have been hit, the deviation of the basic calibration from the optimal calibration result in the positions L' with the beam actual period P.' as shown in FIG. 9 a. In the right part of the figure, the intensities of the signals corresponding to the five measurements are shown.

In a further measurement according to FIG. 9b, deviating positions $L_I$ are controlled, which result in the shown measurements point $L_{1'}$. That is, based on the basic calibration, an alignment error is sent to the deflectors for the electron beam for the measurement in FIG. 9b. The measured intensities corresponding to the five positions are also shown in FIG. 9b shown in the right half of the picture. For the measurement according to FIG. 9c, a signal is provided to the deflectors, for which a target alignment error with respect to the period is present. Since the basic calibration is not sufficiently precise, this alignment error directed towards deflectors result in an intensity contribution, which leads to similar intensities for the one measurement at the five structures. Looking at the standard deviation for the five intensities for the respective measurements of FIGS. 9a, 9b and 9c, the measurement of FIG. 9c result in the smallest standard deviation. Based on the standard deviation of the measurements within the considered section, it can, thus, be determined which of the alignment errors introduced on purpose result in the best measurement result. Since the alignment error introduced on purpose is known, it can be used for correction of the basic calibration. That is, the area of five pixels measured herein, which serve as structures for the calibration, may be calibrated by determining the three standard deviations and the comparison thereof.

If several areas distributed across the substrate are calibrated, the correct calibration can be determined for each of these areas. Between these areas, it can be interpolated with the framework of the evaluation of the calibration, or of with the control of the deflectors under regular operation. It may be assumed that due to the size of the area to be reached by the electron beam, the basic calibration does not have a constant error in all areas of the substrate. This means, the deviation from the basic calibration, that is the introduced alignment error with the smallest standard deviation, may vary with respect to the position Lx and/or the period Px from area to area. Thus, the areas are typically chosen in a size, for which the deviations in the positions and/or the period can be assuming to be constant. The size of these areas depends on the precision of the basic calibration, the precision of the calibration to be gained, and the variation of the increment (pitch) across the entire substrate.

The data, which are evaluated as described above, are based on measurements with a distance Px. This period corresponds about to the structure period PS of the distance of the pixels. The period $P_x$ of the measurement distances is at least larger than ½ $P_S$. Thereby, the beam positions are calibrated by measurements, which have a similar measurement sequence with respect to the distances of the measurement points as used for the future testing of, for example, TFT-displays.

Further, for the calculation of the standard deviations and comparison of the standard deviations, measurement values of quasi all measured structures in form of pixels are used. Yet, at least 70% or 80% or 90% of the measure positions are integrated into the calibration. In contrast thereto, for the calibration according to the prior art, only the respective measurement point or the control coordinate thereof, which represents the location of the L-feature, is used.

Figure 10:
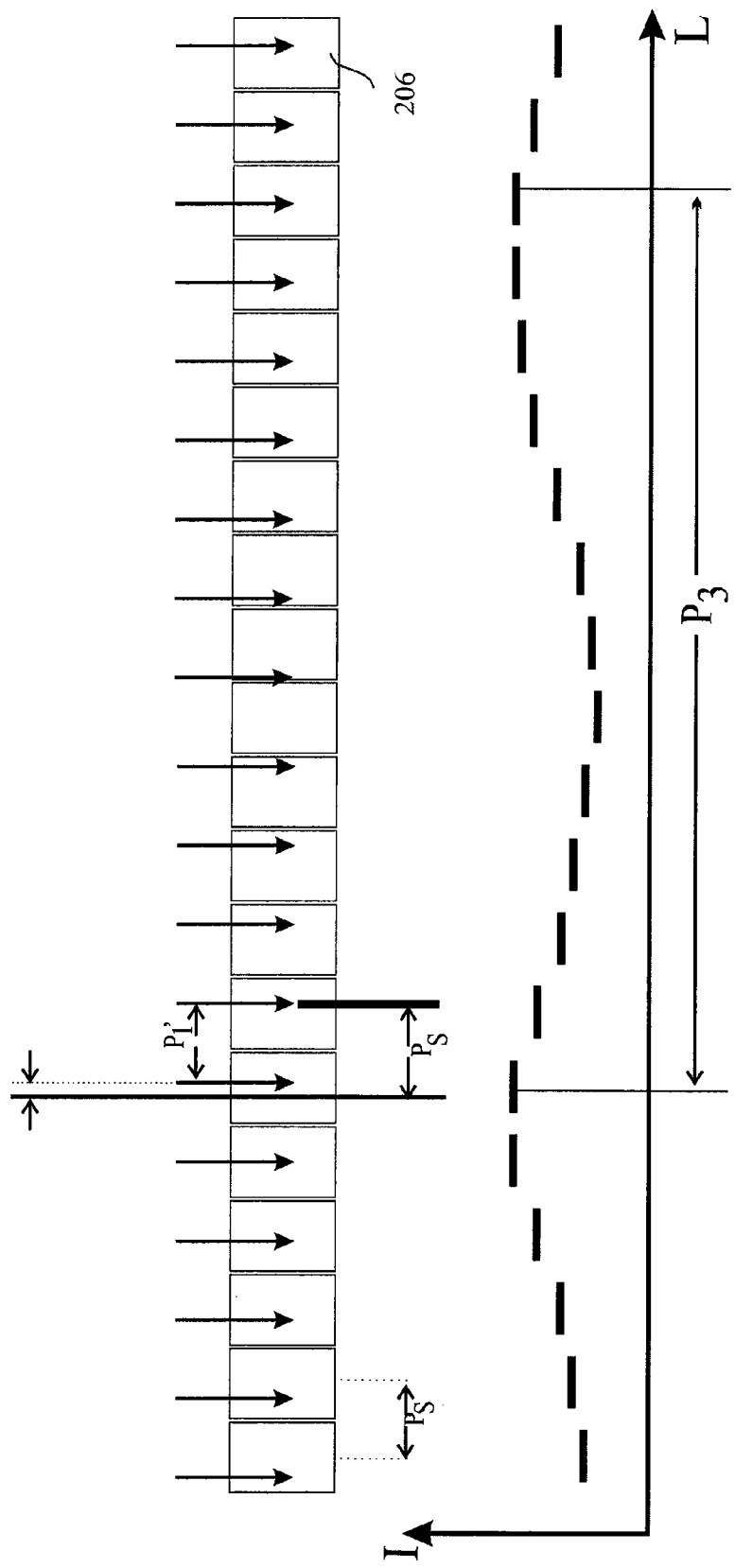
FIG. 10 shows a schematic illustration for explanation of a second evaluation method.

A further possibility of the evaluation of the measurements is now described with respect to FIG. 10. Thereby, the measurements are conducted in larger areas, that is with a higher number of structures 206. Alternatively, the entire area of the structures 206 can be measured. The structures have a distance with the structure period $P_S$.

The beam target period $P_1$ results based on the imperfectness of the basic calibration in distances of the measurement points with the beam actual period $P_{1'}$. Thereby, the beam target period $P_1$ is typically chosen such that also under consideration of the imperfectness of the basic calibration it can be ascertained, that the beam actual period $P_{1'}$ is either larger or smaller as the structure period $P_S$ of the structures 206. As a result of the deviation of the beam actual period $P_{1'}$ from the structure period $P_S$, several of the structures 206 are irradiated in the center thereof, other structures are irradiated at the edge. It is also possible that some structures are not irradiated since the areas between the structures, that is the picture elements, are hit by the electron beam. These varying measurements points with respect to the position result in a fluctuation of the measurement signal, as shown in the lower part of FIG. 10.

This fluctuation is provided by the superposition of the periods $P_{1'}$ and $P_s$. Period $P_3$ of the measured intensities can be determined by according evaluation of the measured intensities.

Since:

$$\frac{P_S}{\Delta P} = \frac{P_3}{P_1'} \text{ and } \Delta P = P_S - P_1'$$

it is $$P_1' = P_3 P_S / (P_3 + P_S).$$

In other words:

$$P_3 = nP_S \text{ und } P_3 = (n+1)P_{1'}.$$

If the period $P_3$ is not a multiple of $P_S$ or $P_{1'}$, a more complex calculation is given, which, however, may be conducted analogously.

Consequently, after the determination of the superposition period $P_3$ by image recognition software or the like, the actually used beam actual period $P_1$ can be determined. The deviation from the adjusted beam target period $P_1$ thereof can be used for the calibration of the beam positions.

As already explained with respect to FIG. 9, the error of the basic calibration may vary over the entire substrate with respect to the period. For the above described evaluation method, this results also in a variation of the superposition period $P_3$. If, as an example, the entire image area is measured, the local superposition period $P_3$ needs to be determined by methods for image recognition. The local superposition period as a function of the location on the substrate may then be used for a calibration of the respective location.

The data, which is evaluated as described above, relies on measurements with a distance $P_x$ also for these evaluation methods. This period corresponds about to the structure period $P_S$ of the distance of the pixels. The period $P_x$ of the measurement distances is at least larger than ½ $P_S$. Thereby, the beam position is calibrated by measurements, which have a similar measurement sequence with respect to the distances of the measurement points as used for the future testing of, for example, TFT-displays.

Further, again, for the calculation of the standard deviations and comparison of the standard deviations, measurement values of quasi all measured structures in form of pixels are used. Yet, at least 70% or 80% or 90% of the measure positions are integrated into the calibration. In contrast thereto, for the calibration according to the prior art, only the respective measurement point or the control coordinate thereof, which represents the location of the L-feature, is used.

As an example, for simplification, only one dimension is shown for the above described evaluation methods. These methods can sequentially or in parallel be extended to a calibration in two dimensions. For a sequential calibration of the second dimension, first one dimension is calibrated and afterwards the second dimension is calibrated. For a parallel calibration, the measurements are already conducted in two dimensions. The data for the calibration of the dimensions are extracted from these measurements.

The above described methods for calibration of the beam position of a corpuscular beam on a substrate result in the fact, that for example a display to be tested in the system may be used for the calibration. If an intermediate product of a display element (display) is used, which for example needs to be adapted accordingly for optimizing of the calibration measurements, the advantage is given, that additional cost for the manufacturing of a calibration plate can be avoided or significantly reduced. For the usage of the completed display without any special treatment for the calibration, the calibration can further be conducted at any time with the product being present in the system at the time being. The manufacturing or storage of a separate calibration body may be omitted by the invention.

The invention claimed is:

1. Method of calibration of the beam position, in at least a first direction, of a corpuscular beam of a corpuscular beam device in a plane section, comprising:
   providing a calibration body having structures, wherein the structures have a structure period $P_S$ in the at least first direction within the plane section, and a position L intended for the measurement exists within each structure;
   generating at least one detection signal, at respective structures in the section of the calibration body comprising:
      deflecting the corpuscular beam with deflectors onto beam target positions $L_1$ having a beam target period $P_1$, in the at least first direction, which is larger than half of the structure period $P_S$ of the structures;
      wherein the beam target positions having the beam target period are the desired measurement points;
      wherein a basic calibration D1 is used for control of the deflectors; and
      wherein beam target deflections deviate, in the at least first direction, either in the beam target period $P_1$ from the structure period $P_S$ and/or in the beam target position $L_1$ from the positions L;
   detection of signals, which depend on the measurement location within each structure of the calibration body; and
   calculating a new calibration based on the generated detection signals.

2. Method according to claim 1, wherein the calculating comprises:
   evaluating the generated detector signals with determination of the deviations of the beam actual positions $L_{1'}$, which are generated by the beam target positions $L_1$, from the positions L.

3. Method according to claim 1, wherein the calculating is conducted by determination of a first standard deviation of the detection signals obtained in the plane section, which have been detected from a measurement at several structures.

4. Method according to claim 3, further comprising:
   further generating of a detection signal at the structures in the plane section of the calibration body with an altered beam target deflection with respect to the beam target period $P_1$ and/or the beam target position $L_1$;
   determining a second standard deviation of the detection signals from the altered beam target deviation; and
   comparing the first and the second standard deviation.

5. Method according to claim 1, wherein the calculating is conducted by determination of the period $P_3$ of the signal waveform, which originates from the superposition of the structure period $P_S$ and the beam actual period $P_{1'}$ resulting from the beam target period $P_1$.

6. Method according to claim 1, wherein the plane section corresponds to the entire area to be calibrated.

7. Method according to claim 1, wherein the corpuscular beam is an electron beam.

8. Method according to claim 1, wherein the calibration body is a glass plate with TFT array.

9. Method according to claim 1, wherein the calibration body is a glass plate with structures, which is a pre-stage of a display element array in the manufacturing.

10. Method according to claim 1, wherein the structure period $P_S$ of the structures of the calibration body is in the range of 50 µm to 500 µm.

11. Method according to claim 1, wherein the structures of the calibration body are picture element structures of an display element array generated on a glass plate.

12. Method according to claim 1, wherein the beam target period $P_1$ has a deviation from that structure period $P_S$ in the range of 1% to 20%.

13. Method according to claim 1, wherein a look-up table is used as a basic calibration.

14. Method according to claim 1, wherein theoretical values are used as a basic calibration.

15. Method according to claim 1, wherein data of a system of a same type is used as a basic calibration.

16. Method according to claim 1, wherein the periods relate to the at least first direction of the plane section.

17. Method according to claim 1, wherein further periods and calibration steps according to claim 1 relate to a second direction of the plane section, respectively.

18. Method according to claim 1, wherein for the calibration, the deviation of the beam actual period $P_{1'}$ of the measurement points from the beam target period $P_1$ of the measurement points, or the deviation of the beam actual position $L_1$ of the measurement points from the beam target position $L_1$ of the measurement points, is determined; and wherein the determination of the deviation is based on calculations, which use at least 50% of the measured signals.

19. Method according to claim 1, wherein for the calibration, the beam actual period $P_{1'}$ of the measurement points and/or the beam actual position $L_{1'}$ of the measurement points is determined; and thereby for the determination of a beam actual period $P_{1'}$ and/or a beam actual position $L_{1'}$, several structures are irradiated with the corpuscular beam.

20. A non-transitory computer readable medium for control of a method according to claim 1.

21. Method according to claim 1, wherein the calibration body comprises structures, which have distances of a structure period $P_S$, and the structure period $P_S$ is in the range of 0.005% to 0.5% of the deflection range of the corpuscular beam of the corpuscular beam device, and the structure period $P_S$ is in the range of 10 μm to 1.5 mm.

22. Method according to claim 1, wherein the calibration body is a display or an intermediate product generated by the manufacturing of the display.

* * * * *

UNITED STATES PATENT AND TRADEMARK OFFICE
CERTIFICATE OF CORRECTION

PATENT NO. : 8,009,299 B2
APPLICATION NO. : 11/813334
DATED : August 30, 2011
INVENTOR(S) : Brunner et al.

It is certified that error appears in the above-identified patent and that said Letters Patent is hereby corrected as shown below:

In the Brief Description of the Drawings:

Column 5, Line 8, please delete "an";

In the Detailed Description of the Invention:

Column 8, Line 20, please delete "U" and insert -- L'-- therefor;

Column 8, Line 27, please delete "U" and insert -- L' -- therefor;

Column 10, Lines 50-51, please delete

" $\frac{P_S}{\Delta P} = \frac{P_3}{P'_1}$ and $\Delta P = P_S - P'_1$ " and insert -- $\frac{P_S}{\Delta P} = \frac{P_3}{P'_1}$ and $\Delta P = P_S - P'_1$ -- therefor;

Column 10, Line 59, please delete "$P_3 = nP_S$  und  $P_3 = (n+1)P_1$" and insert -- $P_3 = nP_S$  und  $P_3 = (n+1)P'_1$ -- therefor.

Signed and Sealed this
Sixth Day of December, 2011

David J. Kappos
*Director of the United States Patent and Trademark Office*

UNITED STATES PATENT AND TRADEMARK OFFICE
CERTIFICATE OF CORRECTION

PATENT NO. : 8,009,299 B2
APPLICATION NO. : 11/813334
DATED : August 30, 2011
INVENTOR(S) : Brunner et al.

Page 1 of 1

It is certified that error appears in the above-identified patent and that said Letters Patent is hereby corrected as shown below:

In the Brief Description of the Drawings:

Column 5, Line 8, please delete "an";

In the Detailed Description of the Invention:

Column 8, Line 20, please delete "U" and insert -- L'-- therefor;

Column 8, Line 27, please delete "U" and insert -- L' -- therefor;

Column 10, Lines 50-51, please delete

" $\frac{P_S}{\Delta P} = \frac{P_3}{P'_1}$ and $\Delta P = P_S - P'_1$ " and insert -- $\frac{P_S}{\Delta P} = \frac{P_3}{P'_1}$ and $\Delta P = P_S - P'_1$ -- therefor;

Column 10, Line 59, please delete "$P_3 = nP_S$ and $P_3 = (n+1)P_{1'}$" and insert -- $P_3 = nP_S$ and $P_3 = (n+1)P_1'$ -- therefor.

This certificate supersedes the Certificate of Correction issued December 6, 2011.

Signed and Sealed this
Ninth Day of April, 2013

Teresa Stanek Rea
*Acting Director of the United States Patent and Trademark Office*